(12) United States Patent
Cerio, Jr.

(10) Patent No.: US 7,348,266 B2
(45) Date of Patent: Mar. 25, 2008

(54) METHOD AND APPARATUS FOR A METALLIC DRY-FILLING PROCESS

(75) Inventor: Frank M. Cerio, Jr., Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 11/241,741

(22) Filed: Sep. 30, 2005

(65) Prior Publication Data

US 2007/0077683 A1    Apr. 5, 2007

(51) Int. Cl.
  *H01L 21/3205*  (2006.01)
  *H01L 21/4763*  (2006.01)
  *H01L 21/44*   (2006.01)

(52) U.S. Cl. .................. 438/586; 438/99; 438/596; 438/610; 257/E21.011

(58) Field of Classification Search .............. 438/99, 438/586, 596, 610; 257/E21.011
See application file for complete search history.

(56) References Cited

U.S. PATENT DOCUMENTS

| | | | |
|---|---|---|---|
| 5,946,183 A | 8/1999 | Yamada et al. | |
| 6,080,287 A | 6/2000 | Drewery et al. | |
| 6,134,096 A | 10/2000 | Yamada et al. | |
| 6,197,165 B1 | 3/2001 | Drewery et al. | |
| 6,287,435 B1 | 9/2001 | Drewery et al. | |
| 6,746,915 B2 * | 6/2004 | Wu | 438/253 |
| 6,755,945 B2 | 6/2004 | Yasar et al. | |
| 7,214,603 B2 * | 5/2007 | Dellaguardia et al. | 438/597 |
| 7,256,147 B2 * | 8/2007 | Yamada et al. | 438/795 |
| 2002/0001931 A1 * | 1/2002 | Kim et al. | 438/586 |
| 2004/0188239 A1 | 9/2004 | Robison et al. | |

* cited by examiner

Primary Examiner—Scott B. Geyer
Assistant Examiner—Seahvosh Nikmanesh
(74) Attorney, Agent, or Firm—Wood, Herron & Evans, L.L.P.

(57) ABSTRACT

An iPVD system is programmed to deposit uniform material, such as a metallic material, into high aspect ratio nano-sized features on semiconductor substrates using a process that enhances the feature filling compared to the field deposition, while maximizing the size of the grain features in the deposited material opening at the top of the feature during the process. Plural sequential dry filling plasma processes are used with backside gas pressure varied to control substrate temperature.

38 Claims, 9 Drawing Sheets

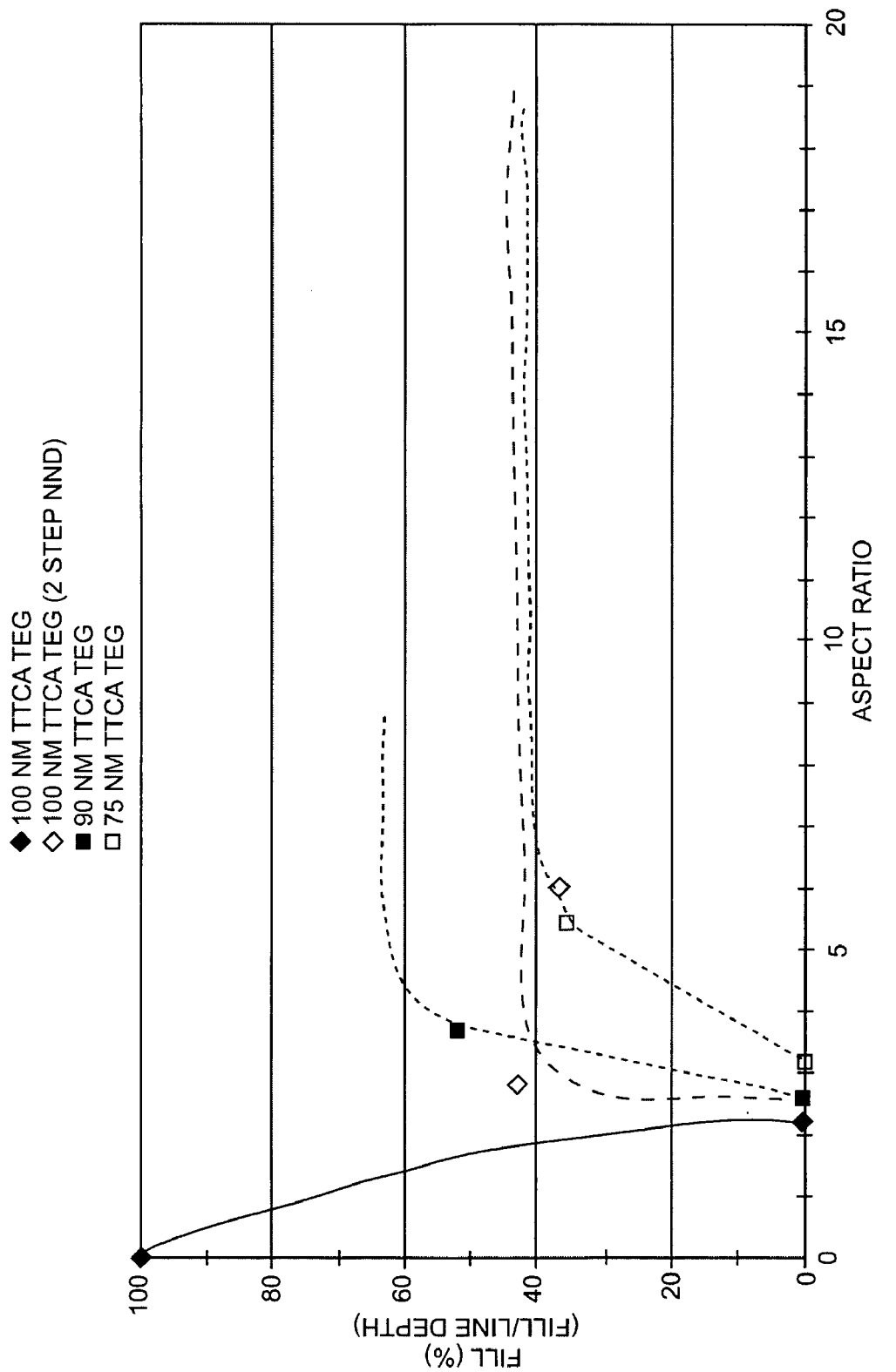

METHOD AND APPARATUS FOR A METALLIC DRY-FILLING PROCESS

This application is related to commonly assigned and co-pending U.S. Patent Application Publication No. 20040188239, filed Mar. 5, 2004, which is a Continuation-in-Part of U.S. Pat. No. 6,755,945, and to co-pending U.S. Patent Application Express Mail No. EV488818521US, titled "A METHOD AND APPARATUS FOR A METALLIC DRY-FILLING PROCESS" filed on even date herewith, all hereby expressly incorporated herein by reference.

FIELD OF THE INVENTION

The invention relates to the metallization of via and trench structures on semiconductor wafers. More particularly, the invention relates to the dry-filling of high aspect ratio via and trench structures of silicon wafers utilizing ionized metallic materials.

BACKGROUND OF THE INVENTION

In the metallization of high aspect ratio vias and trenches on semiconductor wafers, it is required that the barrier and seed layer have good sidewall coverage. It is also important to have a void-free metal deposition.

Ionized PVD deposition is used for barrier and seed layer metallization in advanced IC wafers. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Accordingly, there is a need to further control the quality of the metal deposited in high aspect ratio vias and trenches during the deposition step.

SUMMARY OF THE INVENTION

The invention provides a method of filling a plurality of ultra-small (nano-sized) features by applying a first backside pressure to a backside of the patterned substrate using a backside gas thereby establishing a substrate temperature; creating a first dry-filling plasma during a first dry-filling process, wherein a first amount of metal is deposited at a first rate into a plurality of nano-sized features of the patterned substrate; changing a thermal conductivity between the substrate holder and the patterned substrate by applying a second backside pressure, wherein the second backside pressure is different than the first backside pressure thereby allowing the substrate temperature to change; creating a second dry-filling plasma during a second dry-filling process, wherein a second amount of metal is deposited at a second rate into the plurality of nano-sized features of the patterned substrate. For example, the thermal conductivity between the substrate holder and the patterned substrate is decreased by applying a second backside pressure that is less than the first backside pressure to allow the substrate temperature to increase. Further, following the first or second dry filling process or both, the plasma may be extinguished during a shutdown time to allow the substrate temperature to decrease.

Further, the method may be performed by using a deposition system that includes a processing chamber, a gas supply system coupled to the processing chamber, an inductively coupled plasma (ICP) source coupled to the processing chamber, a metallic target coupled to the processing chamber, a DC source coupled to the metallic target, a substrate holder coupled to the processing chamber, a RF bias generator coupled to the substrate holder, and a backside gas supply system coupled to the substrate holder, the method includes clamping a patterned substrate onto the substrate holder, wherein the substrate holder comprises an electrostatic chuck and an electrostatic force is applied to the patterned substrate.

BRIEF DESCRIPTION OF THE DRAWINGS

A more complete understanding of various embodiments of the invention and many of the attendant advantages thereof will become readily apparent with reference to the following detailed description, particularly when considered in conjunction with the accompanying drawings, in which:

FIG. 7 illustrates a graph of additional exemplary results in accordance with embodiments of the invention.

DETAILED DESCRIPTION OF SEVERAL EMBODIMENTS

Figure 1A:
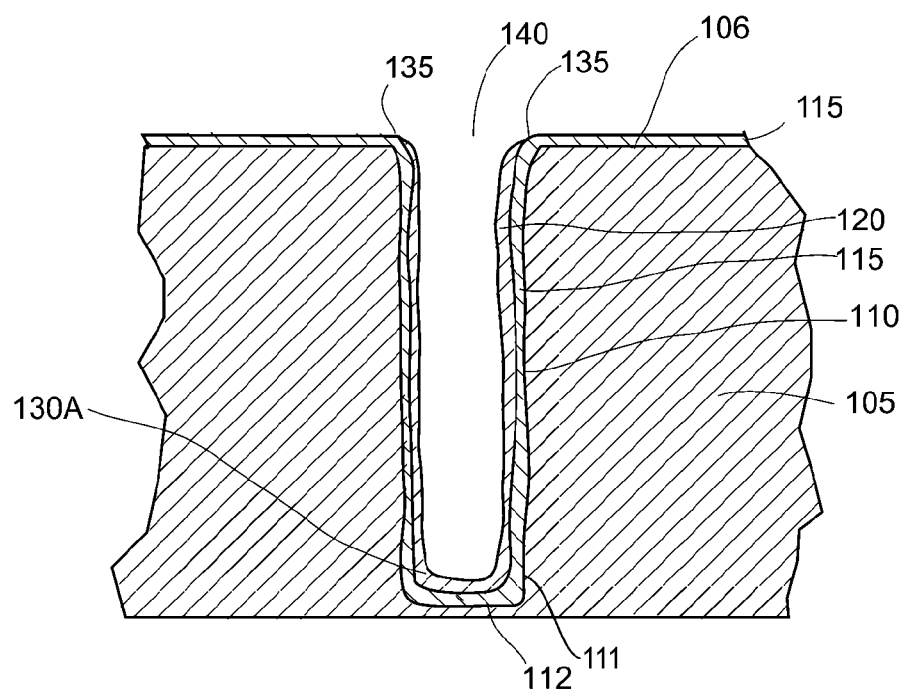
FIGS. 1A-1C illustrate a simplified view of a dry-filling process in accordance with an embodiment of the invention.

A process is described in U.S. Pat. No. 6,755,945 by Yasar et al., which is assigned to the assignee of the present application and provides ionized PVD with sequential deposition and etching. While with this type of sequencing the overhang or overburden are much improved over prior processes, some will still form during the deposition sequence and may not be entirely removed in the etch sequence when the substrate includes nano-sized (ultra-small) features. For example, nano-sized features may have critical dimensions less than 100 nm and depths greater than 250 nm.

Yasar et al. describe a technique to deposit and etch multiple times within a single vacuum chamber. Overhangs and field deposition are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang and field deposition is achieved in the subsequent etch steps.

The invention provides a method of operating an ionized physical vapor deposition (iPVD) system to deposit metallic material into nano-sized features on a patterned substrate on an electrostatic chuck within a processing chamber. The method can include a No Net Deposition (NND) process, where the process parameters are adjusted to cause the net deposition rate to be approximately zero in the field area of the patterned substrate. The iPVD system may also be used to deposit metallic material using a Low Net Deposition (LND) process, where the process parameters are adjusted to establish an ultra-low deposition rate in a field area of the patterned substrate.

The field area refers to the upper surface of the substrate being processed and is the surface into which the nano-sized features, such as high aspect ratio vias and trenches, extend. An ultra-low deposition rate as referred to herein is a deposition rate of less than about 30 nanometers per minute.

An iPVD processing system can be used for the LND and NND processes. These processes can be typically performed in the vacuum processing chamber of an iPVD apparatus in which the substrate to be processed is held on a support. A high-density plasma is maintained in the chamber in a processing gas, which can be, for example, an inert gas into which metal or other filling material has been introduced, usually by sputtering from a target. The high-density plasma can be ionized by coupling RF energy into the process gas, often by an inductive coupling from outside of the chamber. The RF energy ionizes both the process gas and a fraction of the dry-filling material, which may be to a low plasma potential of only a few volts, but may be higher. The processing gas and the ionized dry-filling material can then be directed onto the substrate to fill the nano-sized features on the substrate. For the dry-filling processes of the present invention, an iPVD process can be used. The parameters of the iPVD process are controlled to produce a substantially uniform fill across the surface of the substrate with substantially no deposition in the field area of the substrate. When so controlled, the iPVD process produces the desired result of back filling without producing overhangs around the feature openings. Alternatively, an iPVD process may not be required as PVD and other deposition processes may benefit from principles of the invention.

Exemplary embodiments of the method of the invention are described below, which disclose dry-filling techniques for use with an iPVD system to metallize high aspect ratio vias and trenches by depositing ionized metal. In one example, substrate processing may include depositing a thin layer of a barrier metal, depositing a metallic seed layer, and the dry-filling with a metal such as Cu. In another example, substrate processing may include depositing a thin layer of a barrier metal, and the dry-filling with a metal such as Cu.

This invention is distinctly different from prior art which teaches high DC powers with high RF bias powers for increased conformality or the case where several deposition and etch steps are performed within or in different vacuum chambers. This process is characterized by very low deposition rates in the field area of the substrate and substantially larger deposition rates into the nano-sized features of the substrate. For example, the DC power can be reduced to reduce the deposition rate to less than 10 nm/min. Additionally, a range of backside pressures can be applied to the substrate during the deposition.

In addition, other deposition techniques use electro-plating processes. The self-annealing of electroplated (EP) films, lines, and/or vias has provided manufacturing issues such as reliability and reproducibility problems because of changes in the grain size and hardness of the deposited copper.

The present invention eliminates the problems associated with the electroplating techniques. The dry-filling processes described herein have the capability to fill nano-sized features of the patterned substrate in a bottom-up manner without producing voids and without depositing a significant amount of material in the field area of the patterned substrate.

Figure 1B:
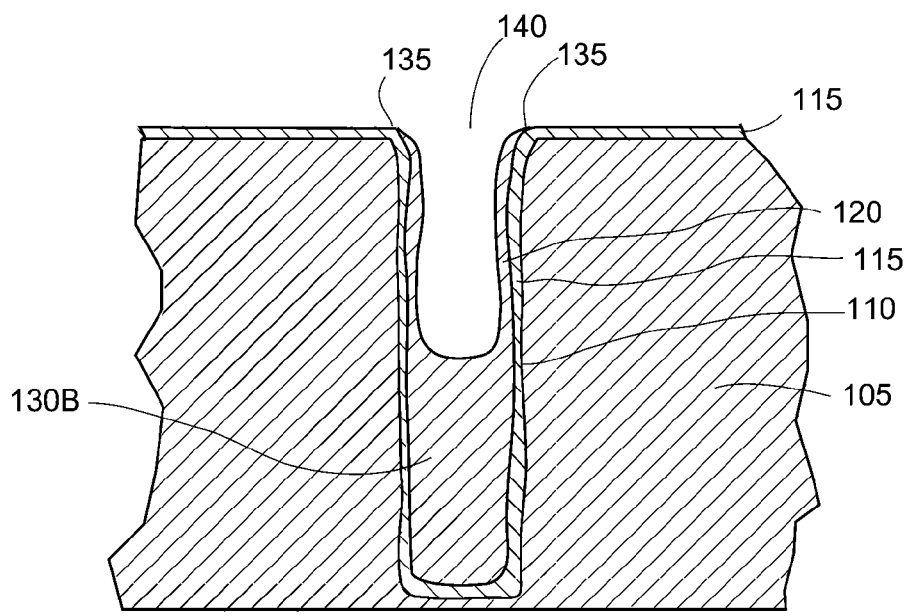
Figure 1C:
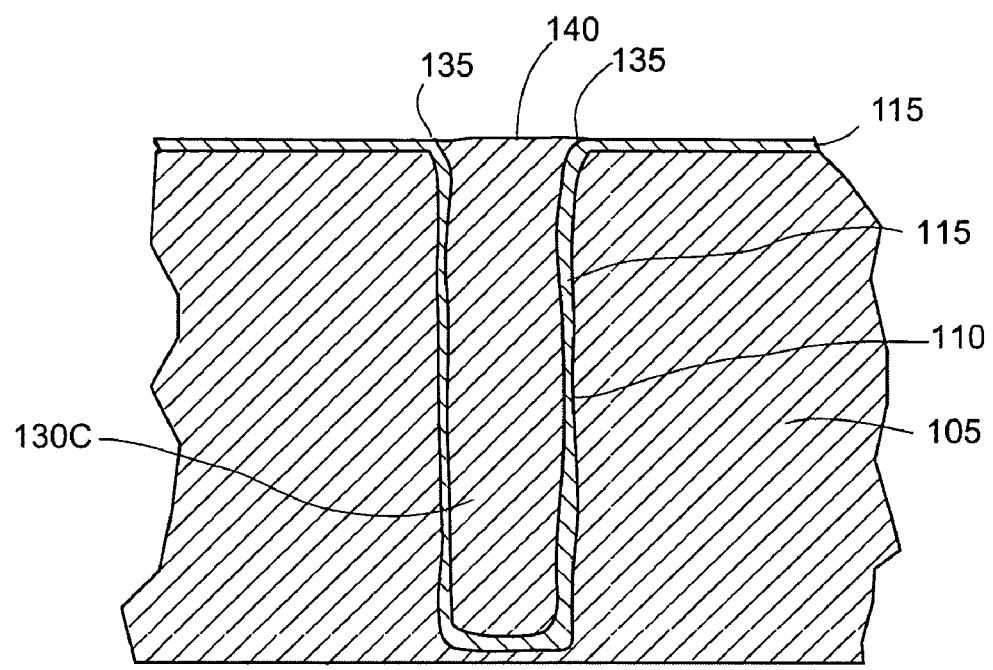

FIGS. 1A-1C illustrate a simplified view of a dry-filling process in accordance with an embodiment of the invention. In the illustrated embodiment, a three-step process is shown, but this is not required for the invention. Alternatively, a different number of steps may be used.

In FIG. 1A, a simplified cross-section is shown for a substrate 105 and a feature structure 110 that can represent a trench or a via. In the illustrated embodiment, a single feature is shown, but this is for illustration purposes only.

A barrier layer 115 is shown on the top surface 106 of the substrate 105, the sidewall surface 111 of the feature 110, and the bottom surface 112 of the feature 110. In addition, a seed layer 120 is shown on top of the barrier layer 115 on the sidewall surface 111 of the feature 110, and on the bottom surface 112 of the feature 110 of the surface.

In the illustrated embodiment shown in FIG. 1A, a first portion of material 130A is shown in the bottom portion of the feature. For example, the first portion of material 130A can be deposited during a first dry-filling process. Alternatively, this first portion can be deposited during a seed layer deposition.

The barrier and seed layer have uniform coverage along the high aspect-ratio feature sidewall surfaces, and have minimum overhang 135 at the top opening 140 of the features. The barrier/seed layers can comprise sputtered Ta/TaN. It is well known that TaN has good adhesion to $SiO_2$-based substrates and tantalum has good adhesion to copper that can help to reduce copper migration along grain boundaries and stress-induced voiding. In addition, α-tantalum has a lower resistivity and helps with the formation of low-resistivity copper having a (111) orientation in the high aspect ratio features during a dry-filling process.

The inventor believes that the texture of the seed layer plays a role in the development of the texture of the copper deposited during the dry-filling process. It is believed that a larger grain size in the seed layer will result in a larger grain size in the deposited material. In addition, the inventor believes that the texture of the seed layer copper is important since the texture of the dry-filled copper will be similar to the texture of seed layer copper. The inventor believes that the (111) texture is desirable.

In FIG. 1B, a simplified cross-section is shown for a substrate 105 and a feature structure 110 that can represent a trench or a via. In the illustrated embodiment, a single feature is shown, but this is for illustration purposes only.

A barrier layer 115 is shown on the top surface 106 of the substrate 105, the sidewall surface 111 of the feature 110, and the bottom surface 112 of the feature 110. In addition, a seed layer 120 is shown on top of the barrier layer 115 on the sidewall surface 111 of the feature 110, and on the bottom surface 112 of the feature 110.

In the illustrated embodiment shown in FIG. 1B, an additional portion of material 130B is shown in the lower portion of the feature. For example, the additional portion of material 130B can be deposited during a second dry-filling process. Alternatively, the deposited amount can be different and one or more dry-filling processes may be performed. In addition, the sidewall coverage remains uniform, the feature opening 140 remains substantially unrestricted, and the overhang 135 continues to be minimized.

In FIG. 1C, a simplified cross-section of a completely filled feature 115 is shown for a substrate 105 and a feature structure 110 that can represent a trench or a via. In the illustrated embodiment, a single feature is shown, but this is for illustration purposes only. A barrier layer 115 is shown on the top surface 106 of the substrate 105, the sidewall surface 111 of the feature 110, and the bottom surface 112 of the feature 110.

In the illustrated embodiment shown in FIG. 1C, a third portion of material 130C is shown that fills the feature 115. For example, the third portion of material 130C can be deposited during one or more dry-filling processes. Alternatively, the deposited amount can be different and the feature can be overfilled or under-filled. During a dry-filling process, the feature 115 has been filled in a bottom-up manner without voids.

Copper can crystallize into a number of different structures. For example, a single copper crystal can have a face centered cubic structure with four Cu atoms per three unit cell and a lattice parameter equal to 0.361 nm that yields a density of 8.92 g/cm. Deposited crystalline materials such as thin films of Cu, can contain defects such as: point defects, dislocations, grain boundaries, interfaces, voids, and inclusions, and the defects are extremely important when examining the quality and functionality of the thin films. For example, chemical, electrical, and mechanical properties can be altered by the presence of defects. In addition, the properties of crystalline materials are not isotropic but depend on a specific direction in the lattice. For example, in bulk materials isotropic behavior can be assumed when the individual Cu crystals are oriented throughout a piece of bulk material with equal directional probability, and the material's properties can be assumed to be isotropic and can be averaged over the entire sample. When considering thin films, structure/texture can lead to non-isotropic behavior, and structure/texture can be assumed to be the tendency of the individual crystals of a material to assume a preferred crystallographic orientation. For example, structure/texture can affect the oxidation process, film resistivity, and surface energy properties.

When material is deposited using different deposition techniques the structure/texture can be different. Material deposited in the seed layer typically has a different structure than the material deposited during a dry-filling process. For example, the dry-filled copper can have larger grain sizes and larger grain boundary areas than the seed layer copper.

Typically, materials with grain boundaries try to reduce the grain boundary area using grain growth. Grain growth can be driven by forces such as grain boundary energy reduction, surface and interface energy reduction, and strain energy reduction. For example, smaller grain size leads to a larger driving force.

It is well known that copper has anisotropic mechanical characteristics. The surface energy is lowest in the (111) texture, whereas the strain energy is lowered in the (200) texture. The inventors are continuing to develop an understanding of grain structure evolution in the copper deposited during the dry-filled process.

Because temperature changes occur during a dry-filling processes, the driving forces for grain growth can be different during different portions of the process. For example, at lower temperatures, the stress may be low and surface energy may dominate. In this case, the deposited material may prefer a texture that minimizes the surface energy, that is (111) texture. At higher temperatures, the deposited material may be under compressive stress, and grain growth will occur to minimize the strain energy.

The dry-filling procedures, as described herein, can be used to deposit ultra-thin films and/or fill nano-sized features such as trenches and vias. The features can include Damascene structures. Because of the temperature variations during the dry-filling processes, the final grain structures and textures of the films, lines, and vias will depend on the critical balance between surface energy and strain energy. For example, when examining trenches and/or vias, the stress condition and surface energy will be quite different due to the confinement of the trench and/or via sidewalls. In addition, the final grain structure is an important factor that determines long-term reliability of trenches and/or vias.

In addition, some copper interconnections have suffered from early failures that severely reduce the effective lifetime of the semiconductor deices, and some of these failures have been attributed to electro-migration. The grain structure/ texture is known to be a factor that affects electro-migration. For example, lines and/or vias with well aligned (111) texture may be more resistant to electro-migration than those with poorly aligned or (100) texture.

Some prior art deposition methods provide incomplete and/or non-uniform deposition in small features. For example, an incomplete and/or non-uniform deposition may leave a void or a seam line that includes ultra-small voids, and later in the fabrication processes, these voids may begin to grow. The inventors believe that the dry-filling procedures described herein can substantially eliminate the electromigration problems by providing a bottom-up filling process that results in void-free and seam-free material.

Copper interconnects using dual damascene structure can significantly reduce the interconnect resistance and improve the interconnect electro-migration performance. In general, there are three different ways to form a dual damascene structure, i.e. line first, via first, and self-align. The dry-filling procedures described herein can be used for structures created using the three different approaches.

The present invention provides a dry-filling method for depositing copper into nano-sized features that is better than the currently used electroplating (wet) techniques. For example, electroplated copper films are known to have "self-annealing" problems. In addition, the dry-filling process has an advantage over other conventional processes such as physical (PVD) or chemical vapor deposition (CVD) techniques.

In the prior art processes, a CMP process is often used to remove excess material after a deposition process. The CMP process can lead to uniformity problems, contamination issues, and decreases in throughput.

In one embodiment, a dry-filling procedure can be performed such that a CMP process is not required.

When depositing copper into nano-sized features, the copper resistivity can increase significantly due to increased electron scattering on grain boundaries and interfaces and the increased resistivity can decrease the move towards even smaller features. The inventor believes that the dry-filling procedures described herein will provide a means for depositing copper having larger copper grains thereby decreasing the grain boundaries and providing a better electron flow. In addition, the inventor believes that the dry-filling procedures described herein will provide a means for decreasing the size of the barrier layer as nano-sized features get even smaller.

During the dry-filling process, the process is controlled to prevent the agglomeration of copper on the sidewalls as the vias and/or trenches are filled in a bottom-up manner. Agglomeration on the sidewalls of the vias and trenches can cause discontinuities in the deposited material.

Figure 2A:
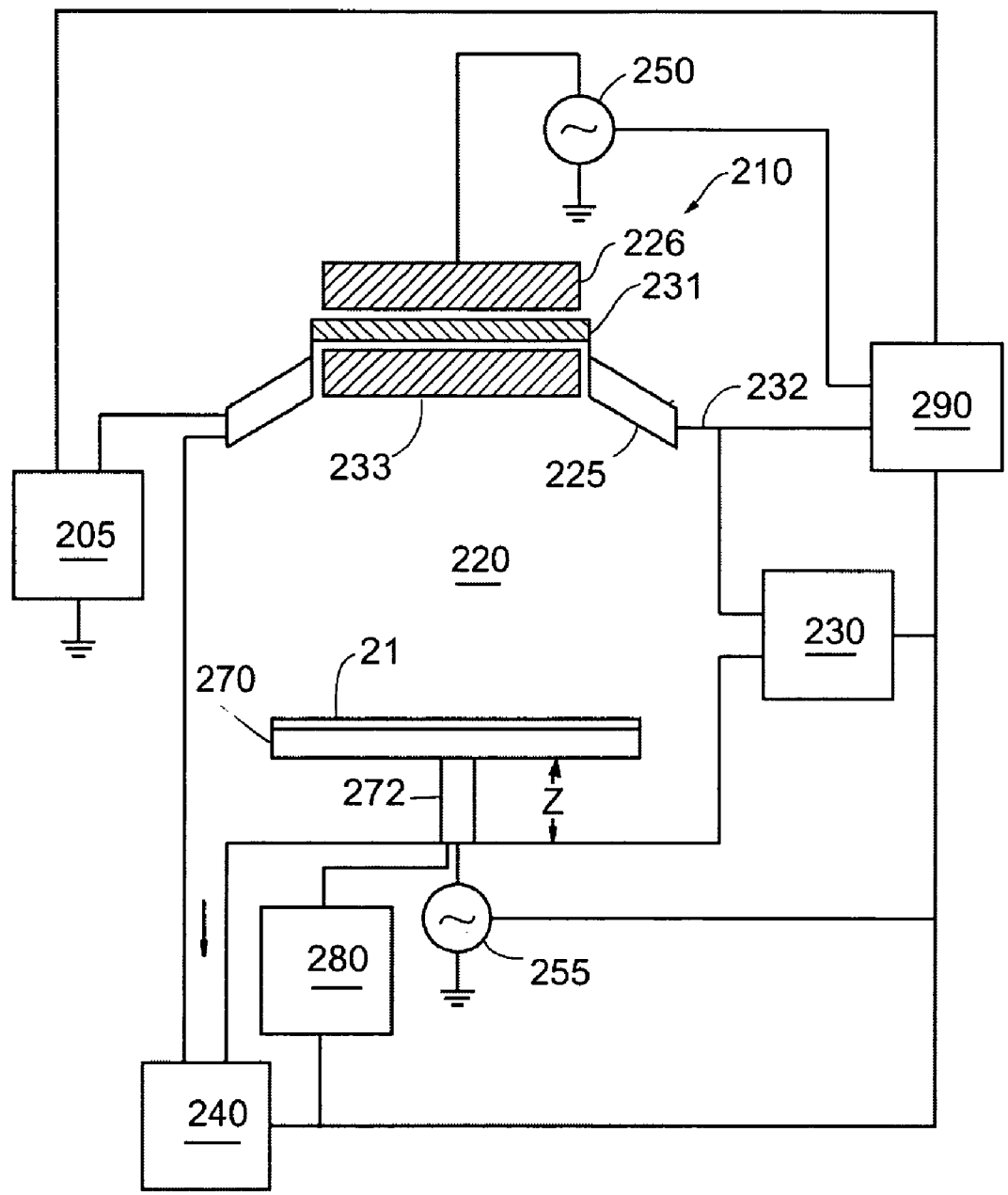
FIG. 2A illustrates an exemplary block diagram of a processing system according to an embodiment of the invention.

FIG. 2A illustrates an exemplary block diagram of a processing system according to an embodiment of the invention. In the illustrated embodiment, an iPVD system 200A is shown.

The iPVD system 200A can comprise an iPVD processing module 210, a DC source 205 coupled to the processing chamber 220, a process gas supply system 230 coupled to a processing chamber 220, a pressure control system 240 coupled to the processing chamber 220, a RF source 250 coupled to the processing chamber 220, an RF bias generator 255 coupled to the processing chamber 220, and a backside gas supply system 280 coupled to the processing chamber 220.

The iPVD system comprises a controller 290 coupled to the processing chamber 220, coupled to the DC source 205, coupled to the gas supply system 230; coupled to the pressure control system 240; coupled to the RF source 250; coupled to the RF bias generator 255; and coupled to the backside gas supply system 280.

The iPVD processing module further comprises an antenna 226, a window 231 coupled to the antenna, a louvered deposition baffle 233 coupled to the window, and a target 225 coupled to the processing chamber 220. RF power can be supplied to the antenna 226 from the RF generator 250, and can be used to create an inductively coupled plasma in the chamber 220.

The antenna 226 can be electrically connected using a RF matching network (not shown) to, and selectively energized or powered by, the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of iPVD systems are described in U.S. Pat. Nos. 6,287,435; 6,080,287; 6,197,165 and 6,132,564, and these patents are hereby expressly incorporated herein by reference.

In one embodiment, a controllable backside pressure can be established that allows the apparatus controller to set the relative influence of the backside pressure on the respective process steps differently, depending on the process parameters. This may include variable backside pressures or flexible duty cycles.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna 226 can be switched between different power levels during the different steps in a deposition and/or dry-filling process.

The iPVD system 200A can also comprise a substrate holder 270 that can include an electrostatic chuck (not shown) and can be coupled to the processing chamber using a Z-motion drive 272. The Z-motion drive 272 can be used to adjust the substrate-to-source distance to provide the best deposition uniformity. The controller 290 can be used to determine the gap size required during the dry-filling process and provide the control data to the Z-motion drive 272 when it is required. During a deposition and/or dry-filling process, the substrate-to-source distance can typically be 150 to 300 mm.

The substrate holder 270 can accommodate a 200 mm wafer, a 300 mm wafer, or a larger wafer. For example, substrate 211 can be transferred into and out of processing chamber 220 through an opening (not shown) that is controlled by a gate valve assembly (not shown). In addition, substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, a substrate 211 can be held in place on top of the substrate holder 270 using an electrostatic chuck (not shown). Alternately, an electrostatic chuck may not be required. In addition, the substrate temperature can be controlled when the substrate is on the substrate holder 270. For example, heating and/or cooling elements (not shown) can be used along with one or more backside gasses. The temperature of the substrate 211 can be controlled to obtain the best via metallization. The controller 290 can be used to determine and control the substrate temperature. In addition, substrate temperature can be controlled by providing the substrate holder 270 with temperature controlling fluid passages (not shown) and the appropriate temperature controls. The thermal conductivity between the substrate holder 270 and the substrate 211 can be controlled by providing backside gas between the substrate 211 and the substrate holder 270. Process parameters can be controlled during the deposition and/or dry-filling steps to ensure that the metal deposited in the via structures is uniform and not agglomerated. For example, heat generated in the substrate 211 during plasma processing can be extracted efficiently by the substrate holder 270 to keep the temperature of the substrate 211 at a substantially constant temperature, or the heat can be used to increase the substrate temperature.

RF bias power can be supplied to the substrate holder 270 using the RF bias generator 255, and can be used to provide a substrate bias. The controller 290 can be used to determine the amount of RF bias power to provide and when to have it applied to the substrate holder 270. For example, RF bias power can be turned on to a level appropriate during deposition and/or dry-filling processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternately, the RF bias generator 255 may be omitted from the processing system and the substrate table may be either grounded or electrically floating. Alternately, other frequencies can be used, such as 2 MHz or 27 MHz.

Process gas can be provided to the processing chamber 220 by the gas supply system 230. The process gas can comprise a metal-containing gas, an inert gas, or a combination thereof. The inert gas may be argon, which is often used, but may also be any other inert gas or may be a non-inert gas that is compatible with the process.

Chamber pressure can be controlled using the pressure control system 240. In addition, process gas can be supplied into the vacuum processing chamber 220 by the gas supply system 230. The chamber pressure can be maintained at a vacuum by the pressure control system 240. The controller 290 can be used to control the flow rate and chemistry for the process gas, and to control the chamber pressure accordingly.

DC power can be supplied from a power source 205 to the target 225. The controller 290 can be used to determine the amount of DC power to provide and when to have it applied to the target. For example, during a DC-on cycle, the DC power to the target 225 can be controlled to produce a substantially uniform deposition and/or dry-filling process, and during a shaping plasma process (controlled DC process), the DC power to the target 225 can be reduced or turned off to shape the size of the feature openings and/or substantially reduce or stop a deposition and/or dry-filling process. In some cases, a shaping plasma process may be performed by reducing the DC power level to a very low level without completely turning it off. In addition, the amount of the overhanging material around the feature openings can be reduced during a shaping plasma process by controlling the ICP power level and the RF bias power level. For example, an inert gas plasma can be used as the shaping plasma. Furthermore, by adjusting (lowering) the RF bias power while maintaining a substantially constant ICP power, the ion bombardment can be adjusted to a level below the etch threshold and this can increase the surface mobility of copper on the sidewall and corner.

The controller 290 can be configured to provide control data to the system components and receive process and/or status data from the system components. For example, the controller 290 can comprise a microprocessor, a memory (e.g., volatile or non-volatile memory), and a digital I/O port capable of generating control voltages sufficient to communicate and activate inputs to the iPVD system 200A as well as monitor outputs from the iPVD system 200A. Moreover, the controller 290 can exchange information with the system components, and a program stored in the memory can be utilized to control the aforementioned components of an iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
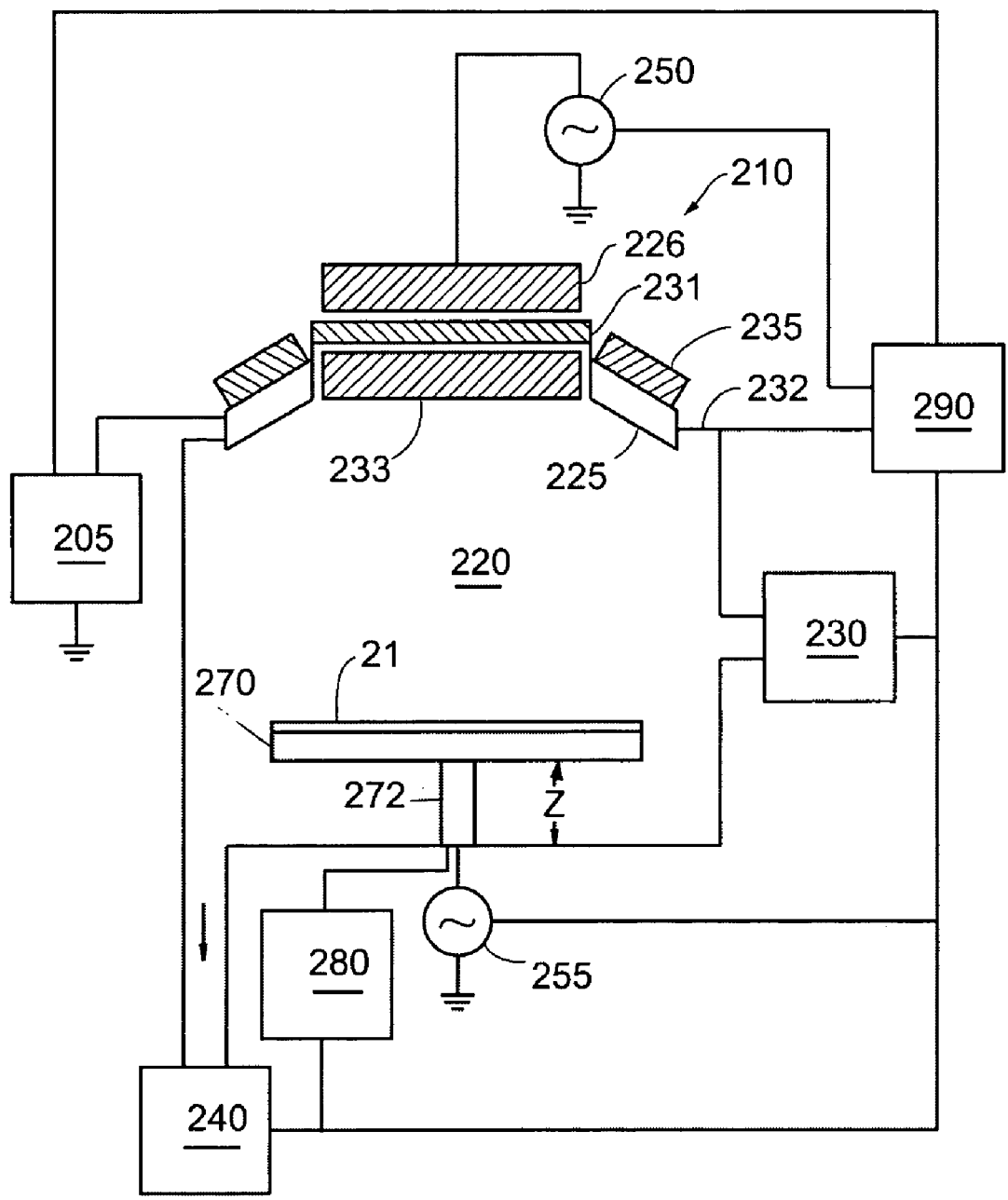
FIG. 2B illustrates an exemplary block diagram of a processing system according to an alternate embodiment of the invention.

FIG. 2B illustrates an exemplary block diagram of a processing system according to an alternate embodiment of the invention. In the illustrated embodiment, an iPVD system 200B is shown.

The iPVD system 200B can comprise an iPVD processing module 210, a DC source 205 coupled to the processing chamber 220, a process gas supply system 230 coupled to a processing chamber 220, a magnet assembly 235 coupled to the processing chamber 220, a pressure control system 240 coupled to the processing chamber 220, a RF source 250 coupled to the processing chamber 220, an RF bias generator 255 coupled to the processing chamber 220, and a backside gas supply system 280 coupled to the processing chamber 220.

The iPVD system 200B comprises a controller 290 coupled to the processing chamber 220, coupled to the DC source 205, coupled to the gas supply system 230, coupled to the magnet assembly 235, coupled to the pressure control system 240, coupled to the RF source 250, coupled to the RF bias generator 255, and coupled to the backside gas supply system 280.

The iPVD processing module 210 further comprises an antenna 226, a window 231 coupled to the antenna, a louvered deposition baffle 233 coupled to the window, a target 225 coupled to the processing chamber 220, and a magnet assembly 235 coupled to the processing chamber 220. RF power can be supplied to the antenna 226 from the RF generator 250, and can be used to create an inductively coupled plasma in the chamber 220.

The antenna 226 can be electrically connected using a RF matching network (not shown) to, and selectively energized or powered by, the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of apparatus having reduced and controllable magnetic fields are described in U.S. Patent Application Publication No. 20040188239, and this patent application is incorporated herein by reference.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna 226 can be switched between different power levels during the different steps in a deposition process.

The iPVD system 200B can also comprise a substrate holder 270 that can include an electrostatic chuck (not shown) and can be coupled to the processing chamber using a Z-motion drive 272. The Z-motion drive 272 can be used to adjust the substrate-to-source distance to provide the best deposition uniformity. The controller 290 can be used to determine the gap size required during the deposition process and provide the control data to the Z-motion drive 272 when it is required. During a deposition and/or dry-filling process, the substrate-to-source distance can typically be 150 to 300 mm.

The substrate holder 270 can accommodate a 200 mm wafer, a 300 mm wafer, or a larger wafer. For example, substrate 211 can be transferred into and out of processing chamber 220 through an opening (not shown) that is controlled by a gate valve assembly (not shown). In addition, substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, a substrate 211 can be held in place on top of the substrate holder 270 using an electrostatic chuck (not shown). Alternately, an electrostatic chuck may not be required. In addition, the substrate temperature can be controlled when the substrate is on the substrate holder 270. For example, heating and/or cooling elements (not shown) can be used along with one or more backside gasses. The temperature of the substrate 211 can be controlled to obtain the best via metallization. The controller 290 can be used to determine and control the substrate temperature. In addition, substrate temperature can be controlled by providing the substrate holder 270 with temperature controlling fluid passages (not shown) and the appropriate temperature controls. Good thermal contact between the substrate holder 270 and the substrate 211 can be achieved by providing backside gas conduction between the substrate 211 and the substrate holder 270. Process parameters can be controlled during the deposition and/or dry-filling steps to ensure that the metal deposited in the via structures is uniform and not agglomerated.

RF bias power can be supplied to the substrate holder 270 using the RF bias generator 255, and can be used to provide a substrate bias. The controller 290 can be used to determine the amount of RF bias power to provide and when to have it applied to the substrate holder 270. For example, RF bias power can be turned on to a level appropriate during deposition and/or dry-filling processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternatively, the RF bias generator 255 may be omitted from the processing system and the substrate table may be either grounded or electrically floating. Alternately, other frequencies can be used, such as 2 MHz or 27 MHz.

Process gas can be provided to the processing chamber 220 by the gas supply system 230. The process gas can comprise a metal-containing gas, an inert gas, or a combination thereof. The inert gas may be argon, which is often used, but may also be any other inert gas or may be a non-inert gas that is compatible with the process.

Chamber pressure can be controlled using the pressure control system 240. In addition, process gas can be supplied into the vacuum processing chamber 220 by the gas supply system 230. The chamber pressure can be maintained at a vacuum by the pressure control system 240. The controller 290 can be used to control the flow rate and chemistry for the process gas, and to control the chamber pressure accordingly.

DC power can be supplied from a power source 205 to the target 225. The controller 290 can be used to determine the amount of DC power to provide and when to have it applied to the target. For example, during a DC-on cycle, the DC power to the target 225 can be controlled to produce a substantially uniform deposition and/or dry-filling process, and during a shaping plasma process, the DC power to the target 225 can be reduced or turned off to shape the size of the feature openings and/or substantially reduce or stop a deposition and/or dry-filling process. In some cases, a shaping plasma process may be performed by reducing the DC power level to a very low level without completely turning it off. In addition, the amount of the overhanging material around the feature openings can be reduced during a shaping plasma process by controlling the ICP power level and the RF bias power level. For example, an inert gas plasma can be used as the shaping plasma. Furthermore, by adjusting (lowering) the RF bias power while maintaining a substantially constant ICP power, the ion bombardment can be adjusted to a level below the etch threshold and this can increase the surface mobility of copper on sidewall and corner.

The controller 290 can be configured to provide control data to the system components and receive process and/or status data from the system components. For example, the controller 290 can comprise a microprocessor, a memory (e.g., volatile or non-volatile memory), and a digital I/O port capable of generating control voltages sufficient to communicate and activate inputs to the iPVD system 200B as well as monitor outputs from the iPVD system 200B. Moreover, the controller 290 can exchange information with the system components, and a program stored in the memory can be utilized to control the aforementioned components of an iPVD system 200B according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 3:
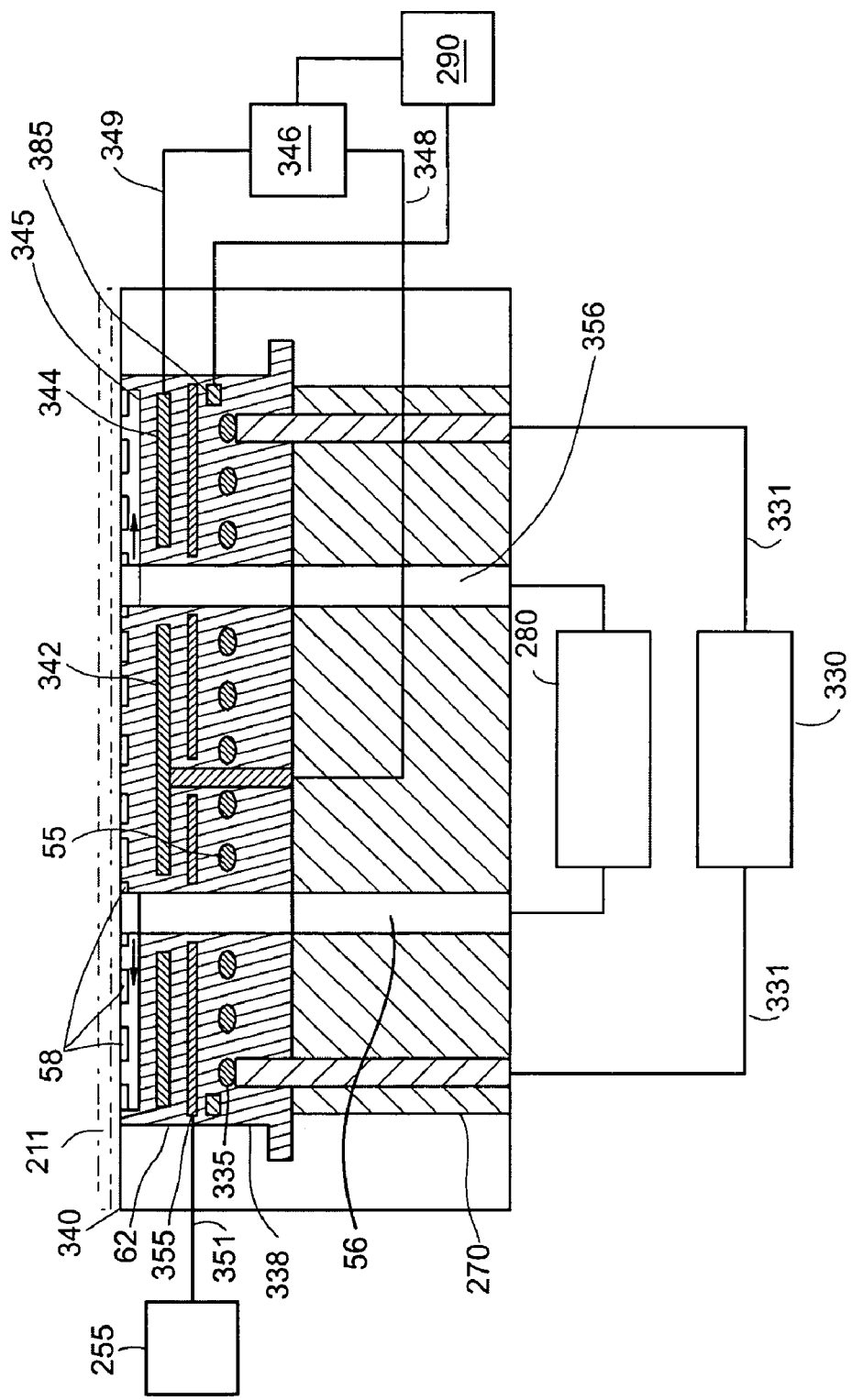
FIG. 3 illustrates a simplified block diagram of a substrate holder in accordance with an embodiment of the invention.

FIG. 3 illustrates a simplified block diagram of a substrate holder in accordance with an embodiment of the invention. In the illustrated embodiment, a substrate holder with an electrostatic chuck is shown, but this is not required for the invention. In an alternate embodiment, an electrostatic chuck may not be required.

With reference to FIG. 3, the substrate holder 270 includes a dielectric body 338 having a support surface 340 that receives the substrate 211. The dielectric body 338 can be fabricated of a ceramic material, such as an aluminum nitride, that has a high electrical resistivity and a suitable thermal conductivity. Alternately, other material may be used.

In one embodiment, a disk-shaped inner electrode 342 and an annular outer electrode 344 that encircles the inner electrode 342 can be embedded within the dielectric body 338. The outer electrode 344 is substantially concentric with the inner electrode 342 and each of the electrodes 342, 344 is formed of a metal such as molybdenum. The inner electrode 342 is electrically isolated from the outer electrode 344, so that electrodes 342, 344 can serve as opposite poles when the electrostatic chuck 345 operates in a bipolar configuration. Alternately, a single element electrode may be used.

The outputs of a variable, high-voltage power supply 346 can be electrically coupled via shielded transmission lines 348, 349 to the electrodes 342, 344 to provide a DC bias potential or clamping voltage. In some embodiments, the high-voltage power supply 346 can be cabled such that the inner electrode 342 is positively biased and the outer electrode 344 is negatively biased. The oppositely-charged inner and outer electrodes 342, 344 establishes a potential difference between the substrate 211 and the electrodes 342, 344 that electrostatically secures the substrate 211 to the support surface 340 with a clamping force proportional to the characteristics of the electrostatic chuck 345 and the applied clamping voltage. The high-voltage power supply 346 is operable to supply a clamping voltage between about negative 1500 Volts and about positive 1500 Volts. Alternately, the variable, high-voltage power supply 346 may be electrically coupled in a different manner.

Although electrostatic chuck 345 is illustrated in FIG. 3 as a bipolar chuck and the discussion below describes the present invention in the context of a bipolar chuck of a Johnsen-Rahbek design, the present invention is not so limited and may use electrostatic chucks with alternative electrode structures, such as monopolar chucks of a Johnsen-Rahbek design and Coulombic chucks. For example, conventional Johnsen-Rahbek chucks are illustrated in U.S. Pat. Nos. 6,134,096 and 5,946,183, and these patents are hereby incorporated by reference herein in their entirety.

A RF power supply 255 is electrically coupled via a shielded transmission line 351 to the electrode 355 to provide a time-dependent bias. The time dependent DC bias attracts ions and radicals from the plasma to the exposed surface of the substrate. The RF power supply 255 typically operates at a frequency of about 13.56 MHz and a power level of less than about 1500 watts, typically about 100 watts. The RF power supply 255 can operated at one or more different levels during the process steps to provide a net negative bias on the substrate 211 to improve and affect the process. For example, the net negative bias can vary from zero volts to several hundred volts.

In one embodiment, the substrate holder 270 can include temperature control elements 335 and the temperature control elements 335 can be coupled 331 to a temperature control unit 330. The temperature control elements 335 can be embedded within the dielectric body 338. In one example, the temperature control elements 335 can comprise one or more resistive heating element, having the form of a grid mesh, electrically connected 331 to the temperature control unit 330. The temperature control elements 335 can be electrically isolated from the electrodes 342, 344, and other portions of the substrate holder 270, by the intervening thicknesses of the dielectric material of the dielectric body 338. In addition, the temperature control elements 335 can comprise one or more cooling elements (not shown). In another example, the temperature control elements 335 can include one or more fluid passageways for providing heating and/or cooling fluid to control the temperature of the substrate holder 270. Thermal energy can be transferred to and from temperature control elements 335 through the dielectric body 338 to the support surface 340 and to substrate 211 positioned on the support surface 340. The temperature of the substrate 211 is regulated by varying the temperature of one or more of the temperature control elements 335. Typically, the substrate 211 is held at a specific predetermined temperature during a process step, and the temperature is controlled to ensure a uniform process across the entire substrate 211.

In the illustrated embodiment, two gas passageways 356 are shown, but this is not required for the invention. Alternately, a different number of gas passageways may be provided. In FIG. 3, two gas passageways 356 are shown that extend through the dielectric body 338 to communicate at one end with a network of interconnected gas channels 358 on the surface of the dielectric body 338. Gas channels 358 direct a backside (heat transfer) gas, such as helium or argon, between the support surface 340 and the facing surface of the substrate 211. The other end of each gas passageway 356 communicates with gas lines 358 leading to a backside gas supply system 280. In an alternate embodiment, a multi-zone gas distribution system may be used to independently control the backside pressure in different portions of the substrate. For example, different and independent backside pressure values may be established for the center portion and the edge portion.

The presence of the backside gas promotes the uniform and efficient transfer of heat energy between portions of the support surface 340 and the substrate 211 that are not in actual physical contact by providing an efficient heat transfer medium. To optimize the transfer of heat between the substrate 211 and support surface 340, the electrostatic force can be made approximately uniform to cause a significant portion of the facing surface of the substrate 211 to physically contact the support surface 340 and to contact the surface 340 with a substantially uniform force. The significant physical contact between support surface 340 and substrate 211 also limits the leakage of heat transfer gas from beneath the substrate 211 to maintain a suitable heat transfer gas pressure and improves the transfer of heat therebetween.

One or more temperature sensors 385 can be positioned at one or more locations on or within the dielectric body 338 and can be coupled to a controller 290 that converts signals from the temperature sensors 385 to provide an indication of the temperature of the dielectric body 338. The temperature of the dielectric body 338 can be used to approximate the temperature of the substrate 211 and the controller 290 can provide feedback information to the temperature control unit 330 and the heat transfer gas supply system 280 for regulating the temperature of substrate 211.

The backside gas can be supplied at a pressure in a range from approximately one Torr to approximately ten Torr, which can result in a force due to the pressure differential between the gas pressure and the pressure within the vacuum processing chamber 220 which, as mentioned above, is between about 5 mTorr and about 30 mTorr. The force applied by the backside gas acts to displace the substrate 211 from the support surface 340. To counteract this force, a clamping voltage can be applied to the electrodes 342, 344 of the electrostatic chuck 345 to establish an attractive electrostatic force of a magnitude sufficient to secure the substrate 211 to the support surface 340.

In one embodiment, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate temperature, etc.

The controller 290 can be used to determine the amount of backside pressure to provide and when to have it applied to the substrate. For example, backside pressure can be switched between different levels during a dry-filling and/or deposition process. In addition, thermal conductance between the substrate holder 270 and the substrate 211 can be controlled by providing backside gas between the substrate 211 and the substrate holder 270. For example, backside pressure and/or other process parameters may be controlled during a dry-filling step to ensure that the metal deposition within the features is uniform and not agglomerated. In addition, the performance of the electrostatic chuck 345 may be controlled to compensate for changes in the backside pressure.

Figure 4:
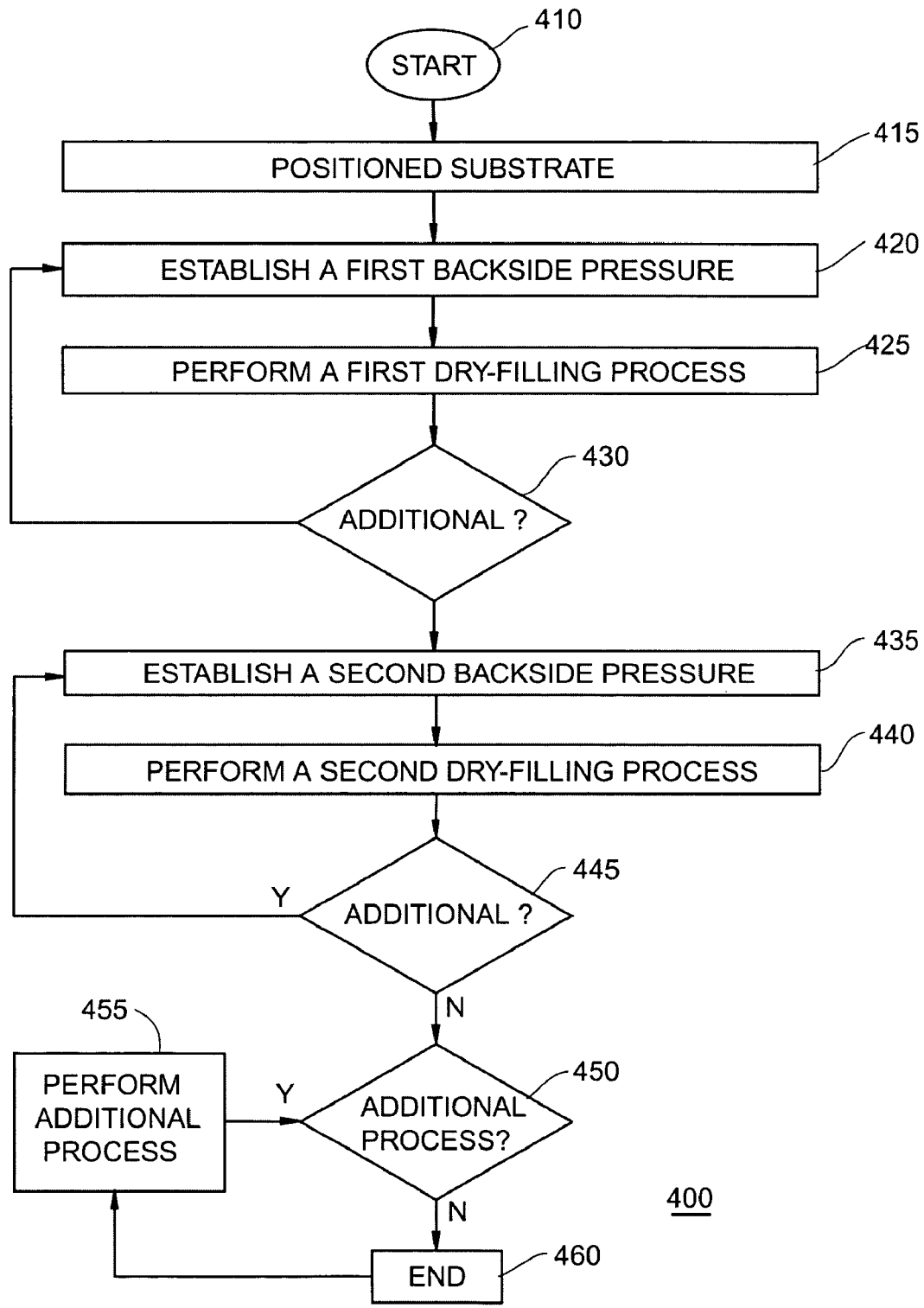
FIG. 4 illustrates a simplified flow diagram of a method of operating a deposition system to perform a process in accordance with an embodiment of the invention.

FIG. 4 illustrates a simplified flow diagram of a method of operating a deposition system to perform a process in accordance with an embodiment of the invention. In the illustrated embodiment, a dry-filling process is shown. In alternate embodiments, other procedures can be performed that may include one or more NND processes, one or more LND processes, and various combinations of LND processes and NND processes. Procedure 400 starts in 410.

In 415, a patterned substrate/wafer can be positioned on a substrate holder and clamped using an electrostatic chuck in a processing chamber as described herein. Alternately, an electrostatic chuck may not be required. For example, the processing chamber can be an iPVD chamber.

In one embodiment, the substrate holder can be vertically translated to establish the required gap between the target and the substrate. Alternately, the gap can be established at a different time or the gap can be changed. For example, the gap may be changed when plasma is not present. The gap size can range from approximately 100 mm to 400 mm. Alternatively, the gap can range from approximately 200 mm to 300 mm.

In 420, a first backside pressure can be established by flowing a backside gas to the backside of the patterned substrate. In one embodiment, a single zone technique can be used. Alternatively, a multi-zone technique may be used. For example, different backside pressures may be established for the center and edge regions.

The thermal conductivity between the substrate holder 270 and the substrate 211 can be varied by controlling the backside pressure established between the substrate 211 and the substrate holder 270. In addition, the backside pressure can be controlled during the deposition and/or dry-filling steps to ensure a uniform fill.

In one embodiment, the backside pressure is varied. so that the temperature of the substrate 211 is maintained at an operating temperature substantially below room temperature at the start of the processing. For example, the operating temperature at the start of the process can be approximately −30° Celsius. Alternatively, a different starting temperature range may be used.

In 425, a first dry-filling process can be performed. During a first dry-filling process time, a first portion of metal is deposited into at least one feature of the patterned substrate. A first high density plasma can be created during a first dry-filling process time. The first high density plasma can be created using a first process gas that can be flowed into the processing chamber using a gas supply system coupled to the processing chamber. In one embodiment, the first process gas can comprise an inert gas. The inert gas can comprise argon, helium, krypton, radon, xenon, or a combination thereof. Alternatively, the first process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

A first ICP power level can be provided by an ICP source operating at a first ICP frequency when creating the first high density plasma. The ICP source can be coupled to an antenna coupled to the processing chamber. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The ICP power can range from approximately 1000 watts to approximately 6000 watts. Alternatively, the ICP power may range from approximately 4500 watts to approximately 5500 watts. For example, the ICP power can be approximately 5250 watts.

In addition, a first RF bias power level can be provided by a RF bias source operating at a first RF bias frequency when creating the first high density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The RF bias power can range from approximately 100 watts to approximately 1000 watts. Alternatively, the RF bias power may range from approximately 200 watts to approximately 400 watts.

Furthermore, a first DC (target) power level can be provided by a DC source coupled to the metallic target while creating the first high density plasma. Alternatively, a target power is not required to create the first high density plasma. The DC power provided by the DC source can range from 0 watts to approximately 6000 watts. Alternatively, the DC power may range from 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

For example, one high density plasma can be created during a DC-on cycle by providing substantially simultaneously a RF bias power to the electrostatic chuck and a target power to the target, and another high density plasma can be created during a shaping plasma process by controlling the amount of DC/target power provided to the target.

In one embodiment, the backside pressure is maintained at a substantially constant value so that the heat generated in the substrate 211 during plasma processing can be efficiently extracted by the substrate holder 270. The backside pressure can be controlled to keep the temperature of the substrate 211 at an operating temperature substantially below room temperature during the first dry-filling process. For example, the backside pressure during the first dry-filling process can be between approximately 5 Torr and approximately 10 Torr. Alternatively, a different backside pressure range may be used. In other embodiments, the backside pressure may be changed during the first dry-filling process. For example, the backside pressure may be stepped, pulsed, cycled, and/or linearly changed during the first dry-filling process.

When the first dry-filling process is performed using the first high density plasma, a first thickness of metal is deposited onto the field area of the patterned substrate and a second thickness of metal is deposited into the bottom portion of at least one feature of the patterned substrate. In the present invention, the controller can establish the process parameters required to minimize the field deposition while maximizing the bottom fill and preventing the formation of voids. For example, the controller can simultaneously control the target power, the RF bias power, the ICP power, the backside pressure, the chamber pressure, the substrate temperature, the process chemistry, or the process time, or a combination thereof to provide a dry-filling process that causes a substantially uniform deposition into the features of the substrate.

In addition, the first high density plasma can be extinguished for a first shutdown period after the first dry-filling process has been performed. The first shutdown period can range from 0 seconds to approximately 100 seconds. Alternatively, the first shutdown period can range from approximately 4 seconds to approximately 20 seconds. During the first shutdown period, the substrate temperature can change. For example, the substrate temperature can decrease when the plasma is extinguished.

In various embodiments, the first dry-filling process may include a number of fill cycles and a number of off-cycles, and a dry-filling process may be repeated a number of times (1-30) to obtain the required fill amount. For example, a dry-filling process may include duration times lasting from 1-1500 seconds for the fill cycles and/or the off-cycles. For example, a NND process can be performed during the first dry-filling process time; the first NND process can have a first fill rate; and the first fill rate can range from 0 nm/min to approximately +15 nm/min.

In 430, a query can be performed to determine when to perform an additional first dry-filling process. When an additional first dry-filling process is required, procedure 400 can branch back to 420 and proceed as shown in FIG. 4. When an additional first dry-filling process is not required, procedure 400 can branch to 435 and proceed as shown in FIG. 4. In one embodiment, one or more process parameters can be changed when the additional first dry-filling process is performed. For example, the backside pressure may be between zero Torr and approximately five Torr. In one embodiment, a process time can be used to determine when to perform an additional first dry-filling process. Alternatively, optical techniques may be used to determine thicknesses.

In 435, a second backside pressure can be established by providing the backside gas to the backside of the patterned substrate. In one embodiment, a single zone technique can be used. Alternatively, a multi-zone technique may be used. The thermal conductivity between the substrate holder 270 and the substrate 211 can be varied by controlling the backside pressure established between the substrate 211 and the substrate holder 270. For example, the second backside pressure may be lower than the first backside pressure causing the substrate temperature to increase. In another embodiment, the temperature of the substrate holder can be changed to change and/or help change the substrate temperature.

In 440, a second dry-filling process can be performed. During a second dry-filling process time, a second portion of metal is deposited into at least one feature of the patterned substrate. In addition, during the second dry-filling process time, a second high density plasma can be created.

A second high density plasma can be created during a second dry-filling process time. The second high density plasma can be created using a second process gas that can be flowed into the processing chamber using a gas supply system coupled to the processing chamber. In one embodiment, the second process gas can comprise an inert gas. The inert gas can comprise argon, helium, krypton, radon, xenon, or a combination thereof. Alternatively, the second process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

A second ICP power level can be provided by an ICP source operating at a second ICP frequency when creating the second high density plasma. The ICP source can be coupled to an antenna coupled to the processing chamber. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The second ICP power can range from approximately 1000 watts to approximately 6000 watts. Alternatively, the second ICP power may range from approximately 4500 watts to approximately 5500 watts. For example, the ICP power can be approximately 5250 watts.

In addition, a second RF bias power level can be provided by a RF bias source operating at a second RF bias frequency when creating the second high density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The second RF bias power can range from approximately 100 watts to approximately 1000 watts. Alternatively, the RF bias power may range from approximately 200 watts to approximately 400 watts.

Furthermore, a second DC power level can be provided by a DC source coupled to the metallic target while creating the second high density plasma. The second DC power provided by the DC source can range from 0 watts to approximately 6000 watts. Alternatively, the second DC power may range from 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

In one embodiment, the backside pressure is controlled so that the heat generated in the substrate 211 during plasma processing can be used to increase the substrate temperature. The backside pressure can be cycled so that the temperature of the substrate 211 increases from a starting temperature below approximately −10° Celsius to a temperature above approximately 100° Celsius during processing. Alternatively, a different temperature range may be used. In another embodiment, the backside pressure may be controlled to maintain and/or decrease the substrate temperature. In another embodiment, the temperature of the substrate holder can be changed to change and/or help change the substrate temperature.

For example, the backside pressure during the second dry-filling process can be maintained at a value between zero Torr and approximately five Torr. Alternatively, a different backside pressure range may be used. In other embodiments, the backside pressure may be changed during the second dry-filling process. For example, the backside pressure may be stepped, pulsed, cycled, and/or linearly changed during the second dry-filling process.

When the second dry-filling process is performed using the second high density plasma, an additional thickness of metal is deposited onto the field area of the patterned substrate and an additional thickness of metal is deposited into the features of the patterned substrate. In the present invention, the controller can establish the process parameters required to maximize the filling of the features, while preventing the formation of voids, minimizing the field deposition, and optimizing the size of the opening at the top of the features.

In one embodiment, the target power can be changed during the second dry-filling process. The second dry-filling process can include one or more DC-on cycles and one or more shaping plasma processes.

In one embodiment, the second high density plasma can be extinguished for a second shutdown period after the second dry-filling process has been performed. The second shutdown period can range from approximately 1 second to approximately 100 seconds. Alternatively, the second shutdown period can range from approximately 4 seconds to approximately 20 seconds. During the second shutdown period, the substrate temperature can change. For example, the substrate temperature can decrease when the plasma is extinguished. In other embodiments, a shutdown period may not be required during every cycle.

In various embodiments, the second dry-filling process may include a number of DC-on cycles, a number of shaping plasma processes, and a number of plasma off-cycles, and the second dry-filling process may be repeated a number of times (1-30) to obtain the required fill amount. For example, a dry-filling process may include process times lasting from 1-1500 seconds for the dry-filling processes, the shaping plasma processes, and/or the off-cycles. For example, a NND process can be performed during the second dry-filling process time; the second NND process can have a second fill rate; and the second fill rate can range from approximately +2 nm/min to approximately +25 nm/min.

In 445, a query can be performed to determine when to perform an additional second dry-filling process. When an additional second dry-filling process is not required, procedure 400 can branch to 450 and proceed as shown in FIG. 4. When an additional second dry-filling process is required, procedure 400 can branch back to 435. In one embodiment, one or more process parameters can be changed when the additional second dry-filling process is performed. For example, the backside pressure may be between zero Torr and approximately five Torr. In one embodiment, a process time can be used to determine when to perform an additional second dry-filling process. Alternatively, optical techniques may be used to determine thicknesses In 450, a query can be performed to determine when to perform an additional process. When an additional process is required, procedure 400 can branch to 455 and proceed as shown in FIG. 4. When an additional process is not required, procedure 400 can end in 460.

In 455, an additional process can be performed. In one embodiment, a third dry-filling process can be performed using a different substrate temperature. For example, lower power plasma conditions and a higher substrate temperature can be used. During a third dry-filling process time, a third portion of metal can be deposited into the features of the patterned substrate.

A third high density plasma can be created during a third dry-filling process time. The third high density plasma can be created using a third process gas that can be flowed into the processing chamber using a gas supply system coupled to the processing chamber. In one embodiment, the third process gas can comprise an inert gas. The inert gas can comprise argon, helium, krypton, radon, xenon, or a combination thereof. Alternatively, the third process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

A third ICP power level can be provided by the ICP source operating at a third ICP frequency when creating the third high density plasma. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The third ICP power can range from approximately 1000 watts to approximately 6000 watts. Alternatively, the third ICP power may range from approximately 4500 watts to approximately 5500 watts. For example, the ICP power can be approximately 5250 watts.

In addition, a third RF bias power level can be provided by a RF bias source operating at a third RF bias frequency when creating the third high density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The third RF bias power can range from approximately 100 watts to approximately 1000 watts. Alternatively, the third RF bias power may range from approximately 200 watts to approximately 400 watts.

Furthermore, a third DC power level can be provided by a DC source coupled to the metallic target while creating the third high density plasma. The third DC power provided by the DC source can range from 0 watts to approximately 6000 watts. Alternatively, the third DC power may range from 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

In one embodiment, the backside pressure is controlled so that the heat generated in the substrate 211 during plasma processing can be used to increase the substrate temperature. The backside pressure can be cycled so that the temperature of the substrate 211 increases from a starting temperature below approximately 20° Celsius to a temperature above approximately 150° Celsius during processing. Alternatively, a different temperature range may be used. In another embodiment, the backside pressure may be controlled to maintain and/or decrease the substrate temperature. In another embodiment, the temperature of the substrate holder can be changed to change and/or help change the substrate temperature.

For example, the backside pressure during the third dry-filling process can be maintained at a value between zero Torr and approximately two Torr. Alternatively, a different backside pressure range may be used. In other embodiments, the backside pressure may be changed during the third dry-filling process. For example, the backside pressure may be stepped, pulsed, cycled, and/or linearly changed during the third dry-filling process.

When the third dry-filling process is performed using the third high density plasma, an additional thickness of metal is deposited onto the field area of the patterned substrate and an additional thickness of metal is deposited into the features of the patterned substrate. In the present invention, the controller can establish the process parameters required to minimize the field deposition while maximizing the feature fill and increasing the surface mobility of the deposited metal in the features. For example, the controller can simultaneously control the target (DC) power, the RF bias power, the ICP power, the backside pressure, the chamber pressure, the substrate temperature, the process chemistry, or the process time, or a combination thereof to provide a second dry-filling process that causes a substantially small amount of net deposition to occur in the field area of the substrate.

In one embodiment, the target power and the RF bias power can be changed during the third dry-filling process. The third dry-filling process can include one or more DC-on cycles and one or more shaping plasma processes. In addition, the RF bias power can be higher during a DC-on cycle than during a shaping plasma process.

In one embodiment, the third high density plasma can be extinguished for a third shutdown period after the third dry-filling process has been performed. The third shutdown period can range from approximately 1 second to approximately 100 seconds. Alternatively, the third shutdown period can range from approximately 4 seconds to approximately 20 seconds. During the third shutdown period, the substrate temperature can change. For example, the substrate temperature can decrease when the plasma is extinguished. In other embodiments, a shutdown period may not be required during every cycle.

In one embodiment, a third amount of metal is deposited into a feature of the patterned substrate at a third rate during a third process time using the third high density plasma. The third dry-filling process may include a number of fill cycles and a number of plasma off-cycles, and a dry-filling process may be repeated a number of times (1-30) to obtain the required fill amount. For example, a dry-filling process may include duration times lasting from 1-1500 seconds for the fill cycles and/or the off-cycles. For example, a NND process can be performed during the third dry-filling process time; the third NND process can have a third fill rate; and the third fill rate can range from approximately +2 nm/min to approximately +25 nm/min.

Figure 5:
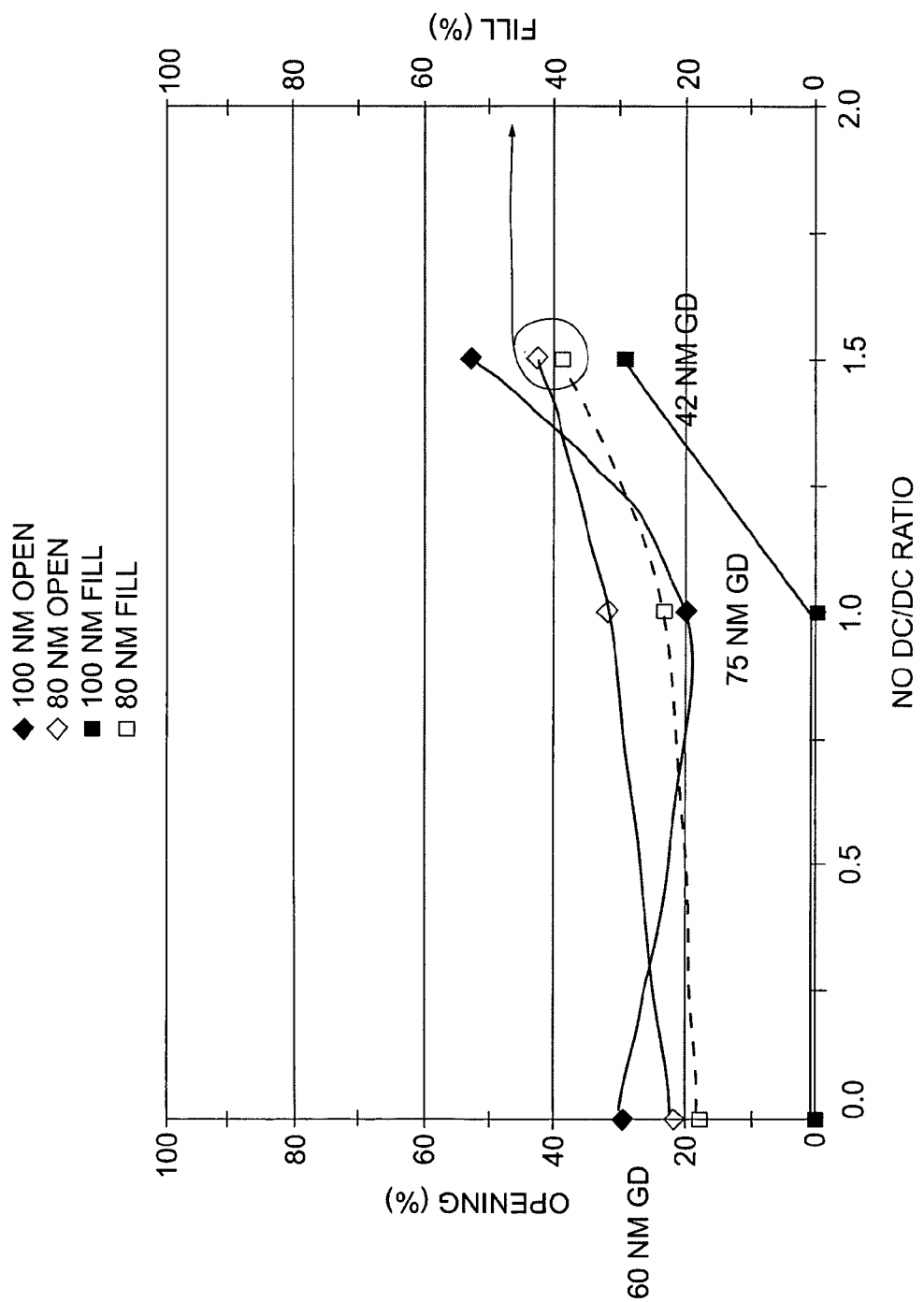
FIGS. 5 and 6 illustrate graphs of exemplary results in accordance with embodiments of the invention.
Figure 6:
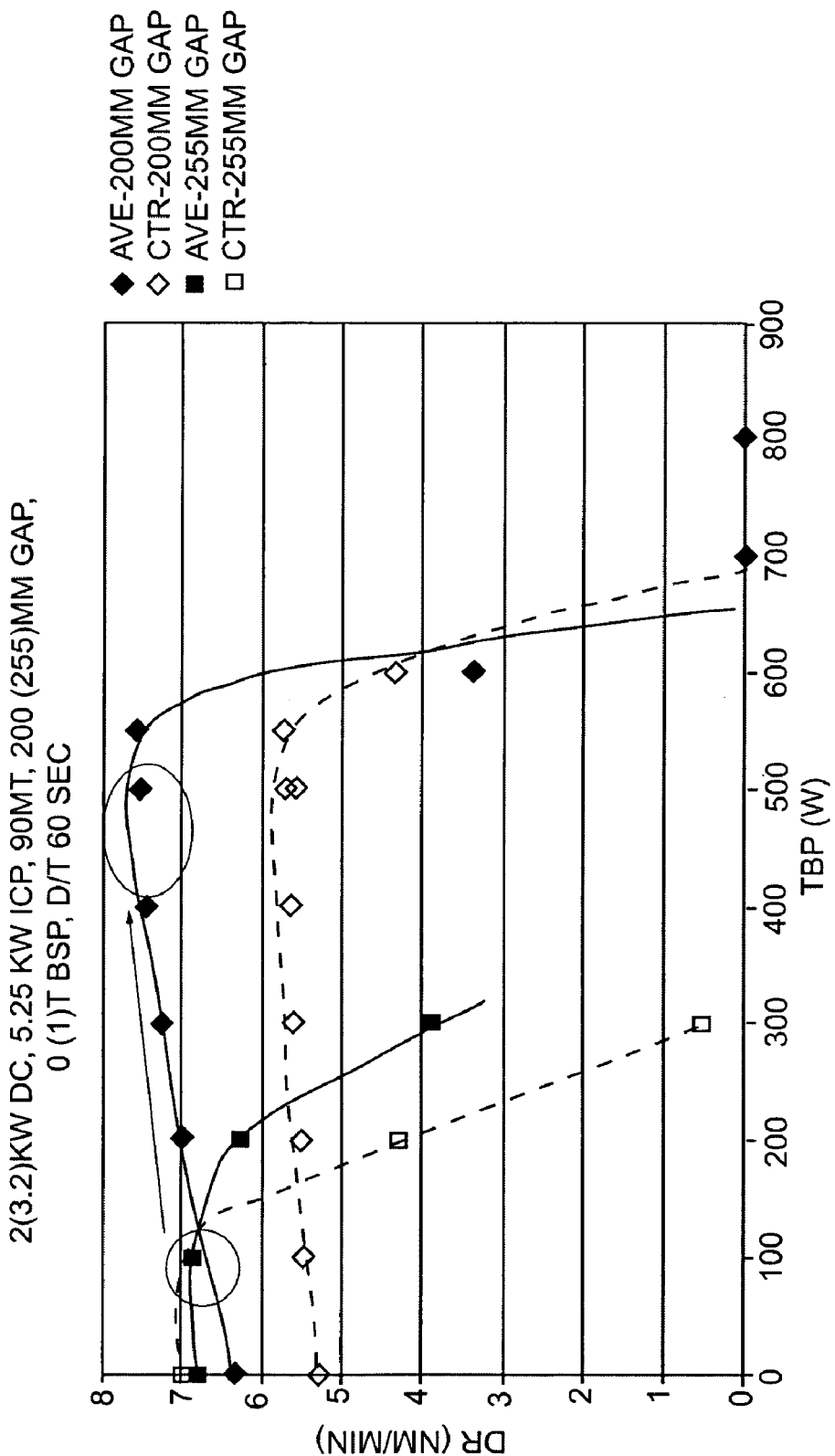

FIGS. 5 and 6 illustrate graphs of exemplary results in accordance with embodiments of the invention; and FIG. 7 illustrates a graph of additional exemplary results in accordance with embodiments of the invention.

Alternatively, the additional process can comprise an LND process, an NND process, an annealing process, a conventional deposition process, an etching process, a deposition/etch process, a cleaning process, a measurement process, a storing process, an electroplating process, or a combination thereof. The additional processes can be performed in the same processing chamber or other processing chambers. For example, one or more processing chambers can be coupled to each other by a transfer system.

In 460, procedure 400 can end. A processing time may be used to determine when to stop a process. Alternately, thickness data can be used to determine when to stop a process.

In some cases, the additional process can be a measurement process. In one embodiment, the wafer can be removed from the processing chamber and measured in another chamber. For example, an optical digital profile (ODP) tool can be used. In addition, a Scanning Electron Microscope (SEM) tool and/or a Transmission Electron Microscope (TEM) tool can be used.

Measurement data can be obtained during a process and used to determine when to stop the process. Measurement data can include back side pressure data, chamber pressure data, chamber temperature data, substrate temperature data, process gas chemistry data, process gas flow rate data, target material data, ICP power data, substrate position data, target power data, RF bias power data, processing time data, process recipe data, or a combination thereof.

In alternate embodiments, a dry-filling process may include a number of DC-on cycles, a number of shaping plasma processes, and a number of off-cycles, and a dry-filling process can also be repeated a number of times (1-20) to fill the nano-sized features. For example, alternate dry-filling processes may include DC-on cycle times that can be equal to approximately 10-1500 seconds, shaping plasma process times that can be equal to approximately 10-500 seconds, and off-cycle times that can be equal to approximately 5-100 seconds.

Barrier processes can be performed before the dry-filling processes and can be performed in the same processing chamber or another processing chamber coupled to a common transfer system. For example, barrier recipes may be as shown in Table 1. In the tables below, the headings refer to the following:

| | |
|---|---|
| Press (mT) | Chamber Pressure in milliTorr |
| ICP (kW) | Inductively Coupled Power to RF antenna in kilowatts |
| DC or DCT (kW) | DC power to target in kilowatts |
| Bias or TBP (W) | Substrate Table Bias Power in watts |
| D/P (sec) | Deposition cycle time in seconds (preceded by number of cycles, if applicable) |
| GD (nm) | Deposited Film Thickness in Flat Field Area in nanometers |
| BSP (T) | Backside Gas Pressure in Torr |
| Gap (mm) | Target to Substrate Spacing in millimeters |

Values separated by slashes (/) separate values for different subcycles, such as for deposition and etching, pulsed target power, etc.

TABLE 1

| | Press. (mT) | ICP (kW) | DC (kW) | N2 Flow (sccm) | Bias (W) | D/T (sec) | GD (nm) | BSP (T) | Gap (mm) |
|---|---|---|---|---|---|---|---|---|---|
| TaN LND | 5 | 5.25 | 1.6 | 23 | 200 | 4 | 3 | 6 | 200 |
| Ta NND | 5 | 5.25 | 3.3 | 0 | 850 | 11 | 11 (2.5) | 6 | 252 |
| TaLND | 5 | 5.25 | 1 | 0 | 200 | 11.1 | 2 | 6 | 252 |

High and low pressure NND processes can also be performed in the same processing chamber or another processing chamber coupled to a common transfer system. For example, LND process recipes may be as shown in Table 2a, Table 2b, Table 2c, and Table 2d.

Multi-step dry-filling processes can be performed in the same processing chamber or another processing chamber coupled to a common transfer system. For example, multi-step process recipes for dry-filling copper may be as shown in Table 3a, Table 3b, and Table 3c.

TABLE 2a

|  | Press. (mT) | ICP (kW) | DC (kW) | Bias (W) | D/T (sec) | GD (nm) | BSP (T) | Gap (mm) | Dep Mode |
|---|---|---|---|---|---|---|---|---|---|
| Cu 1st | 90 | 5.25 | 3.2 | 100 | 6 × 10 | 6.8 | 8 | 255 | NND(−30C) |
| Cu 2nd | 90 | 5.25 | 3.2 | 100 | 2400 | 272 | 0 | 255 | NND(−30C) |

TABLE 2b

|  | Press. (mT) | ICP (kW) | DC (kW) | Bias (W) | D/T (sec) | GD (nm) | BSP (T) | Dep Mode |
|---|---|---|---|---|---|---|---|---|
| Cu 1st | 90 | 5.25 | 3.2 | 100 | 6 × 10 | 6.8 | 8 | NND(−30C) |
| Cu 2nd | 90 | 5.25 | 3.2 | 100 | 600 | 68 | 0 | NND(−30C) |

TABLE 2c

|  | Press. (mT) | ICP (kW) | DC (kW) | Bias (W) | D/T (sec) | GD (nm) | BSP (T) | Gap (mm) | Dep Mode |
|---|---|---|---|---|---|---|---|---|---|
| Cu 1st | 50 | 5.25 | 1.4 | 410 | 6 × 10 | 7 | 8 | 255 | NND(−30C) |
| Cu 2nd | 50 | 5.25 | 0.7/0 | 410 | 1200/1800 | 70 | 1 | 255 | NND(−30C) |

In this example, the Cu $1^{st}$ process included a 10 second continuous dry-filling cycle followed by a 10 second off cycle, and the Cu $2^{nd}$ process included a thirty second continuous dry-filling cycle, a forty-five second shaping plasma process followed by a twenty-five second off cycle.

TABLE 2d

|  | Press. (mT) | ICP (kW) | DC (kW) | Bias (W) | D/T | GD (nm) | BSP (T) | Dep Mod |
|---|---|---|---|---|---|---|---|---|
| Cu | 50 | 5.25 | 1.4 | 410 | 6 × 10 | 7 | 8 | NND(−30C) |
| Cu | 50 | 5.25 | 0.7/0 | 410 | 600/900 | 35 | 1 | NND(−30C) |

TABLE 3a

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 1.4 | 5.25 | 410 | 50 | 255 | 8 | 6 × 10 s | 8 |
| 2 | 1.4/0 | 5.25 | 410/410 | 50 | 255 | 1 | 6 × 25/60 s | 20 |
| 3 | 1.4/0 | 5.25 | 410/103 | 50 | 255 | 0 | 15 × 30/60 s | 60 |

TABLE 3b

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 0.75 | 5.25 | 850 | 50 | 200 | 8 | 6 × 10 s | 6 |
| 2 | .75/0 | 5.25 | 850/850 | 50 | 200 | 1 | 6 × 25/60 s | 15 |
| 3 | .75/0 | 5.25 | 850/200 | 50 | 200 | 0 | 14 × 30/60 s | 42 |

TABLE 3c

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 0.75 | 5.25 | 850 | 50 | 200 | 8 | 6 × 10 s | 6 |
| 2 | .75/0 | 5.25 | 850/850 | 50 | 200 | 1 | 6 × 25/60 s | 15 |
| 3 | .75/0 | 5.25 | 850/200 | 50 | 200 | 0 | 14 × 30/60 s | 42 |

In other embodiments, the additional process can include performing a process, and the LND process can be performed in the same processing chamber. Alternately, the additional process can be performed in a different processing chamber, such as PVD chambers, CVD chambers, and PECVD chambers. A chamber pressure, chamber temperature, substrate temperature, a process gas chemistry, a process gas flow rate, a target material, an ICP power, rate position, a target power, a RF bias power, a process time, or a nation thereof can be adjusted to perform a LND process. The process meters can be adjusted to provide a sputtering value in a range below a sputtering threshold during the LND process. For example, a controller can be and the RF bias power and the LND target power can be adjusted to achieve an ultra-low deposition rate in the field area of the patterned substrate, the ultra-low deposition rate can be less than 30 nm/min.

As the dry-filling processes are performed, metal can be deposited into and/or removed from nano-sized features of the patterned substrate while producing substantially no overhanging material at openings of the features.

During processing, a DC-on process may add a small amount of material on the field area on the top surface of the wafer, and a shaping plasma process may be used to remove material on the field area of the wafer, and thus there is substantially no net deposition at the end of the dry-filling process cycle on the field area of the wafer. In addition, during processing, a DC-on process may add a substantially small amount of material to the openings of the nano-sized features on the wafer and a shaping plasma process may be used to remove material from the openings of the nano-sized features on the wafer, and thus there are no voids in the metal deposited into the nano-sized features on the wafer.

In the metallization of high aspect ratio via holes and trenches on semiconductor wafers, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of filling a plurality of nano-sized features using a deposition system that includes a processing chamber, a gas supply system coupled to the processing chamber, an inductively coupled plasma (ICP) source coupled to the processing chamber, a metallic target coupled to the processing chamber, a DC source coupled to the metallic target, a substrate holder coupled to the processing chamber, a RF bias generator coupled to the substrate holder, and a backside gas supply system coupled to the substrate holder, the method comprising:

clamping a patterned substrate onto the substrate holder, wherein the substrate holder comprises an electrostatic chuck and an electrostatic force is applied to the patterned substrate;

applying a first backside pressure to a backside of the patterned substrate using a backside gas thereby establishing a substrate temperature;

creating a first dry-filling plasma during a first dry-filling process, wherein a first amount of metal is deposited at a first rate into a plurality of nano-sized features of the patterned substrate;

controlling the first dry-filling plasma during a first shutdown time so as to allow the substrate temperature to decrease;

decreasing a thermal conductivity between the substrate holder and the patterned substrate by applying a second backside pressure, wherein the second backside pressure is less than the first backside pressure thereby allowing the substrate temperature to increase;

creating a second dry-filling plasma during a second dry-filling process, wherein a second amount of metal is deposited at a second rate into the plurality of nano-sized features of the patterned substrate; and controlling the second dry-filling plasma during a second shutdown time so as to allow the substrate temperature to decrease.

2. The method as claimed in claim 1, wherein:

the controlling of the first dry-filling plasma includes extinguishing the first dry-filling plasma during a first shutdown time, thereby allowing the substrate temperature to decrease; and the controlling of the second dry-filling plasma includes extinguishing the second dry-filling plasma during a second shutdown time, thereby allowing the substrate temperature to decrease.

3. The method as claimed in claim 2, wherein a first dry-filling process time is greater than 0 seconds and less than approximately 250 seconds, and the first shutdown time is equal to or greater than 0 seconds and less than approximately 50 seconds.

4. The method as claimed in claim 2, wherein the first dry-filling process and the first shutdown time are repeated N1 times, wherein N1 is an integer between 1 and 20.

5. The method as claimed in claim 2, wherein a second dry-filling process time is greater than 0 seconds and less than approximately 250 seconds, and the second shutdown time is equal to or greater than 0 seconds and less than approximately 50 seconds.

6. The method as claimed in claim 2, wherein the second dry-filling process and the second shutdown time are repeated N2 times, wherein N2 is an integer between 1 and 20.

7. The method as claimed in claim 1, further comprising:
maintaining the backside pressure at the first backside pressure during the first dry-filling process, the first backside pressure being greater than or equal to 0 Torr and less than approximately 10 Torr; and
maintaining the backside pressure at the second backside pressure during the second dry-filling process, the second backside pressure being greater than or equal to 0 Torr and less than approximately 8 Torr.

8. The method as claimed in claim 1, further comprising:
maintaining the backside pressure at the first backside pressure during the first dry-filling process, the first backside pressure being greater than 0 Torr and less than approximately 10 Torr; and
cycling the second backside pressure between a first value and a second value during the second dry-filling process, the first value being greater than 0 Torr and less than approximately 5 Torr and the second value being less than approximately 2 Torr.

9. The method as claimed in claim 1, further comprising:
cycling the first backside pressure between a first value and a second value during the first dry-filling process, the first value being greater than 0 Torr and less than approximately 10 Torr and the second value being less than approximately 8 Torr; and
maintaining the backside pressure at the second backside pressure during the second dry-filling process, the second backside pressure being greater than 0 Torr and less than approximately 8 Torr.

10. The method as claimed in claim 1, further comprising:
cycling the first backside pressure between a first value and a second value during the first dry-filling process, the first value being greater than 0 Torr and less than approximately 10 Torr and the second value being less than approximately 8 Torr; and
cycling the second backside pressure between a third value and a fourth value during the second dry-filling process, the third value being greater than 0 Torr and less than approximately 5 Torr and the fourth value being less than approximately 2 Torr.

11. The method as claimed in claim 1, further comprising:
operating the DC source at a first DC power during the first dry-filling process, the first DC power level being greater than 0 Watts and less than approximately 2000 Watts; and
operating the DC source at a second DC power during the second dry-filling process, the second DC power level being greater than 0 Watts and less than approximately 2000 Watts.

12. The method as claimed in claim 1, further comprising:
operating the ICP source at a first ICP frequency during the first dry-filling process, the first ICP frequency being greater than approximately 1 MHz and less than approximately 100 MHz;
operating the ICP source at a first ICP power during the first dry-filling process, the first ICP power level being greater than approximately 1000 Watts and less than approximately 6000 Watts;
operating the ICP source at a second ICP frequency during the second dry-filling process, the second ICP frequency being greater than approximately 1 MHz and less than approximately 100 MHz; and
operating the ICP source at a second ICP power during the second dry-filling process, the second ICP power level being greater than approximately 1000 Watts and less than approximately 6000 Watts.

13. The method as claimed in claim 12, wherein the first ICP power level is greater than approximately 4800 Watts and less than approximately 5600 Watts and the second ICP power level is greater than approximately 4800 Watts and less than approximately 5600 Watts.

14. The method as claimed in claim 1, further comprising:
operating the RF bias source at a first RF bias frequency during the first dry-filling process, the first RF bias frequency being greater than approximately 10 MHz and less than approximately 100 MHz;
operating the RF bias source at a first RF bias power during the first dry-filling process, the first RF bias power level being greater than 0 Watts and less than approximately 1200 Watts;
operating the RF bias source at a second RF bias frequency during the second dry-filling process, the second RF bias frequency being greater than approximately 10 MHz and less than approximately 100 MHz; and
operating the RF bias source at a second RF bias power during the second dry-filling process, the second RF bias power level being greater than 0 Watts and less than approximately 1200 Watts.

15. The method as claimed in claim 14, wherein the first RF bias power level is greater than approximately 100 Watts and less than approximately 600 Watts and the second RF bias power level is greater than approximately 50 Watts and less than approximately 600 Watts.

16. The method as claimed in claim 14, further comprising:
cycling the RF bias power between a first value and a second value during the second dry-filling process, the first value being greater than approximately 200 Watts and less than approximately 600 Watts and the second value being greater than approximately 100 Watts and less than approximately 600 Watts.

17. The method as claimed in claim 1, further comprising:
performing a first No Net Deposition (NND) process during the first dry-filling process, wherein the first fill rate ranges from approximately +1 nm/min to approximately +15 nm/min; and
performing a second NND process during the second dry-filling process, wherein the second fill rate ranges from approximately +2 nm/min to approximately +25 nm/min.

18. The method as claimed in claim 1, further comprising:
establishing a first substrate temperature during the first dry-filling process, the first substrate temperature being greater than or equal to approximately −50° Celsius and less than approximately −10° Celsius; and
establishing a second substrate temperature during the second dry-filling process, the second substrate temperature being greater than or equal to approximately 10° Celsius and less than approximately 150° Celsius.

19. The method as claimed in claim 1, further comprising:
decreasing the thermal conductivity between the substrate holder and the patterned substrate by applying a third backside pressure, the third backside pressure being less than the second backside pressure thereby allowing the substrate temperature to increase; and creating a third dry-filling plasma during a third dry-filling process, a third amount of metal being deposited at a third rate into the plurality of nano-sized features of the patterned substrate.

20. The method as claimed in claim 19, further comprising:
extinguishing the third dry-filling plasma during a third shutdown time, thereby allowing the substrate temperature to decrease.

21. The method as claimed in claim 20, wherein a third dry-filling process time is greater than 0 seconds and less than approximately 250 seconds, and the third shutdown time is equal to or greater than 0 seconds and less than approximately 50 seconds.

22. The method as claimed in claim 20, wherein the third dry-filling process and the third shutdown time are repeated N3 times, wherein N3 is an integer between 1 and 20.

23. The method as claimed in claim 19, further comprising:
maintaining the backside pressure at the third backside pressure during the third dry-filling process, the third backside pressure being greater than 0 Torr and less than approximately 4 Torr.

24. The method as claimed in claim 19, further comprising:
cycling the third backside pressure between a first value and a second value during the third dry-filling process, the first value being greater than 0 Torr and less than approximately 5 Torr and the second value being less than approximately 2 Torr.

25. The method as claimed in claim 19, further comprising:
operating the DC source at a third DC power level during the third dry-filling process, the third DC power level being equal to or greater than 0 Watts and less than approximately 2000 Watts.

26. The method as claimed in claim 19, further comprising:
operating the ICP source at a third ICP frequency during the third dry-filling process, the third ICP frequency being greater than approximately 10 MHz and less than approximately 100 MHz; and
operating the ICP source at a third ICP power level during the third dry-filling process, the third ICP power level being greater than approximately 1000 Watts and less than approximately 6000 Watts.

27. The method as claimed in claim 19, further comprising:
operating the RF bias source at a third RF bias frequency during the third dry-filling process, the third RF bias frequency being greater than approximately 10 MHz and less than approximately 100 MHz; and
operating the RF bias source at a third RF bias power level during the third dry-filling process, the third RF bias power level being greater than approximately 50 Watts and less than approximately 500 Watts.

28. The method as claimed in claim 27, further comprising:
cycling the third dry-filling RF bias power between a first value and a second value during the third dry-filling process, the first value level being greater than approximately 200 Watts and less than approximately 600 Watts and the second value being greater than approximately 50 Watts and less than approximately 500 Watts.

29. The method as claimed in claim 19, further comprising:
performing a third No Net Deposition (NND) process during the third dry-filling process, wherein the third fill rate ranges from approximately +1 nm/min to approximately +15 nm/min.

30. The method as claimed in claim 14, further comprising:
establishing a third substrate temperature during the third dry-filling process, the third substrate temperature being greater than or equal to approximately 10° Celsius and less than approximately 250° Celsius.

31. The method as claimed in claim 1, wherein the backside gas supply system operates to provide a backside gas comprising argon, helium, krypton, helium, radon, or xenon, or a combination thereof.

32. The method as claimed in claim 1, wherein the metal comprises tungsten (W), copper (Cu), tantalum (Ta), titanium, (Ti), ruthenium (Ru), iridium (Ir), aluminum (Al), silver (Ag), platinum (Pt), or gold (Au), or a combination thereof.

33. The method as claimed in claim 32, wherein the metal comprises copper (Cu), or aluminum (Al), or a combination thereof.

34. The method as claimed in claim 1, further comprising:
providing a process gas to the processing chamber, wherein the process gas comprises an inert gas, a nitrogen-containing gas, an oxygen-containing gas, or a metal-containing gas, or a combination thereof.

35. The method as claimed in claim 1, wherein a gap is established between a top portion of the processing chamber and the substrate holder, the gap being less than approximately 300 mm.

36. The method as claimed in claim 1, further comprising:
establishing a chamber pressure, wherein the chamber pressure is greater than or equal to approximately 10 mTorr and less than approximately 100 mTorr.

37. The method as claimed in claim 1, further comprising performing an additional process before performing the first dry-filling process, wherein the additional process includes a barrier layer deposition process, a seed layer deposition process, a LND process, or a NND process, or a combination thereof.

38. The method as claimed in claim 1, further comprising performing an additional process after performing the second dry-filling process, wherein the additional process includes an electro-less plating process, an electroplating process, a heat treatment process, an annealing process, a polishing process, a LND process, or a NND process, or a combination thereof.

* * * * *

UNITED STATES PATENT AND TRADEMARK OFFICE
CERTIFICATE OF CORRECTION

| | |
|---|---|
| PATENT NO. | : 7,348,266 B2 |
| APPLICATION NO. | : 11/241741 |
| DATED | : March 25, 2008 |
| INVENTOR(S) | : Frank M. Cerio, Jr. |

Page 1 of 1

It is certified that error appears in the above-identified patent and that said Letters Patent is hereby corrected as shown below:

In Column 6, line 11, "semiconductor deices," should read --semiconductor devices,--.

In Column 13, line 28, "can operated" should read --can be operated--.

In Column 13, line 39, "resistive heating element," should read --resistive heating elements,--.

In Column 19, line 47, "determine thicknesses" should read --determine thicknesses.--.

In Column 23, the last column of Table 2d, "Dep Mod" should read --Dep Mode--.

In Column 25, line 11, "performing a process," should read --performing an LND process,--.

In Column 25, lines 17-18, "rate position" should read --substrate position--.

In Column 25, line 19, "a nation thereof" should read --a combination thereof--.

In Column 25, line 20, "The process meters" should read --The process parameters--.

In Column 25, line 22, "controller can be and the RF" should read --controller can be used, and the RF--.

In Column 30, line 25, Claim 32, "titanium, (Ti)," should read --titanium (Ti),--.

Signed and Sealed this

Twenty-seventh Day of October, 2009

David J. Kappos
*Director of the United States Patent and Trademark Office*